United States Patent
He et al.

(10) Patent No.: US 11,678,479 B2
(45) Date of Patent: Jun. 13, 2023

(54) METHOD OF FABRICATING SEMICONDUCTOR DEVICE HAVING VOID IN BIT LINE CONTACT PLUG

(71) Applicant: Fujian Jinhua Integrated Circuit Co., Ltd., Quanzhou (CN)

(72) Inventors: Shi-Wei He, Nan'an (CN); Te-Hao Huang, Hsinchu County (TW); Hsien-Shih Chu, Kaohsiung (TW); Yun-Fan Chou, Taichung (TW); Feng-Ming Huang, Pingtung County (TW)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 17/482,456

(22) Filed: Sep. 23, 2021

(65) Prior Publication Data

US 2022/0013528 A1    Jan. 13, 2022

Related U.S. Application Data

(62) Division of application No. 16/635,465, filed as application No. PCT/CN2019/124589 on Dec. 11, 2019, now Pat. No. 11,164,877.

(30) Foreign Application Priority Data

Sep. 17, 2019    (CN) .......................... 201910877052.X (51) Int. Cl.
    *H10B 12/00*    (2023.01)

(52) U.S. Cl.
    CPC ......... *H10B 12/485* (2023.02); *H10B 12/053* (2023.02); *H10B 12/315* (2023.02); *H10B 12/34* (2023.02)

(58) Field of Classification Search
    CPC ......... H01L 27/10814; H01L 27/10823; H01L 27/10876; H01L 27/10885; H01L 27/10888
    USPC ......................................................... 438/262
    See application file for complete search history.

(56) References Cited

U.S. PATENT DOCUMENTS

2002/0036349 A1*  3/2002  Saito .................... H01L 23/485
                                                        257/E23.169
2018/0130805 A1*  5/2018  Cho .................. H01L 27/10823

* cited by examiner

*Primary Examiner* — Hoai V Pham
(74) *Attorney, Agent, or Firm* — Winston Hsu (57) ABSTRACT

A semiconductor device, a method of fabricating the semiconductor device and a memory are disclosed. In the provided semiconductor device, bit line contact plugs partially reside on insulating material layers in gate trenches in active areas and thus can come into sufficient contact with the active areas. This ensures good electrical transmission between the bit line contact plugs and the active areas even when there are internal voids in the bit line contact plugs. Such bit line contact plugs allowed to contain internal voids can be fabricated in an easier and faster manner, thus allowing a significantly enhanced memory fabrication throughput.

16 Claims, 7 Drawing Sheets

METHOD OF FABRICATING SEMICONDUCTOR DEVICE HAVING VOID IN BIT LINE CONTACT PLUG

CROSS REFERENCE TO RELATED APPLICATIONS

This application is a Divisional of application Ser. No. 16/635,465 filed Jan. 30, 2020, and included herein by reference.

BACKGROUND OF THE INVENTION

1. Field of the Invention

The present invention relates to the field of semiconductor technology and, in particular, to a semiconductor device, a method of fabricating the semiconductor device and a memory.

2. Description of the Prior Art

The ever-advancing semiconductor technology is leading to increasing miniaturization of semiconductor devices, which in turn makes the fabrication of such devices more difficult, less productive and less efficient in the utilization of semiconductor fabrication equipment.

For example, a memory, such as a dynamic random access memory (DRAM), typically includes storage transistors, as well as bit lines and word lines for selection of a corresponding storage transistor by using the bit lines and the word lines and activation of the selected storage transistor.

During the fabrication of an existing memory, in order to ensure good electrical connections between bit lines and storage transistors, the processes used to form the bit lines (in particular, contact plugs thereof), such as deposition, are typically imposed with stringent requirements. This would slow down the fabrication and lower both the productivity and utilization rate of fabrication equipment.

SUMMARY OF THE INVENTION

It is an objective of the present invention to provide a semiconductor device which can be fabricated in an easier way, thus expediting the fabrication and resulting in a higher throughput.

To this end, the provided semiconductor device includes a substrate having a plurality of active areas and at least one gate trench formed therein, the gate trench being located at least partially within the plurality of active areas; a buried gate and an insulating material layer formed in the gate trench, the insulating material layer being located on the buried gate; and a bit line contact plug formed over a portion of the insulating material layer and coupled to one of the plurality of active areas, the bit line contact plug containing a void.

The present invention also provides a memory, including a substrate, in which a plurality of active areas are formed; and at least one bit line formed on the substrate, each extending in a first direction so as to be electrically connected to corresponding ones of the plurality of active areas and comprising a first conductive layer and a second conductive layer stacked on the first conductive layer, the first conductive layer coupled to the corresponding active areas and forming bit line contact plugs, each of the bit line contact plugs having a maximum width that is greater than a maximum width of the second conductive layer, each of the bit line contact plugs containing at least one internal void formed therein.

Accordingly, the present invention also provides a method of fabricating a semiconductor device, including providing a substrate, in which a plurality of active areas are defined; forming at least one gate trench in the substrate so that the gate trench is located at least partially within the plurality of active areas; sequentially filling a buried gate and an insulating material layer in the gate trench; and forming at least one bit line contact plug on the substrate, each formed over a portion of the insulating material layer and coupled to one of the plurality of active areas, each of the at least one bit line contact plug containing a void.

In the semiconductor device provided in the present invention, each bit line contact plug partially resides on the insulating material layer and is coupled to the active area. That is to say, in addition to the active area, the bit line contact plug additionally extends laterally over part of the buried gate. Such an increased width of the bit line contact plug can maximize its contact area, and thus minimize its contact resistance, with the active area. As a result, even when there is a void within the bit line contact plug, its sufficient contact with the active area can still ensure good signal transmission therewith. Additionally, such a bit line contact plug allowed to contain a void can be fabricated using a rapid deposition process, which can expedite the fabrication of the bit line contact plug itself and hence of the semiconductor device. This can result in an enhanced throughput and higher utilization of the semiconductor fabrication equipment.

These and other objectives of the present invention will no doubt become obvious to those of ordinary skill in the art after reading the following detailed description of the preferred embodiment that is illustrated in the various figures and drawings.

LIST OF REFERENCE NUMERALS IN THE DRAWINGS

100 Substrate
101 Trench Isolation Structure
110 First Source/Drain Region
120 Second Source/Drain Region
200 Word Line
200a Word Line Trench
210 Insulating Material Layer
300 Bit Line
310/310' Bit Line Contact Plug
310a/310a' Internal Void
310b Arcuate Side face Portion 320 Second Conductive Layer
330 Third Conductive Layer
340 Cap Layer
400 Isolation Layer
510 First Sacrificial Material Layer
520 Second Sacrificial Material Layer
600 Bit Line Trench
610 First Trench
620 Second Trench
630 Third Trench
AA Active Area

DETAILED DESCRIPTION

Specific embodiments of the proposed semiconductor device, method and memory will be described in greater detailed below with reference to the accompanying drawings. From the following detailed description, features and advantages of the invention will be more apparent. Note that the drawings are provided in a very simplified form not necessarily drawn to scale, and their only intention is to facilitate convenience and clarity in explaining the embodiments.

Embodiment 1

Figure 1:
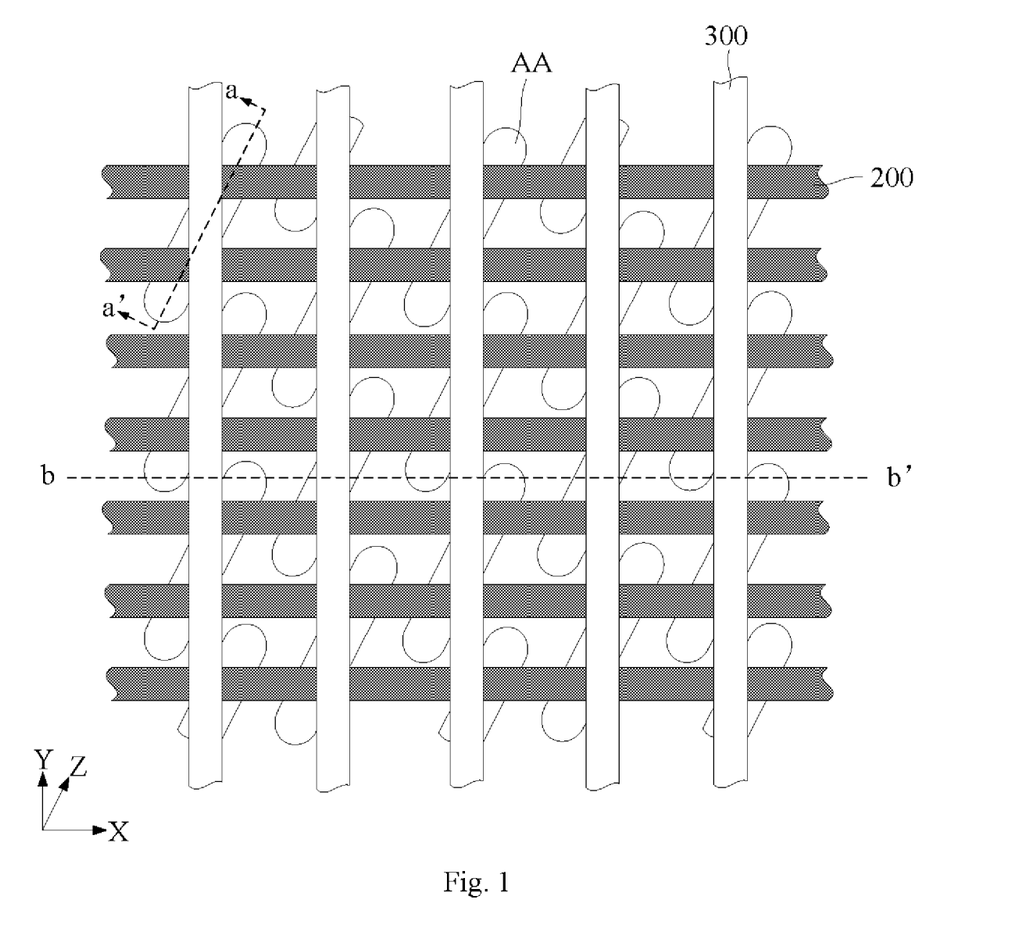
FIG. 1 is a top view of a semiconductor device according to a first embodiment of the present invention.
Figure 2A:
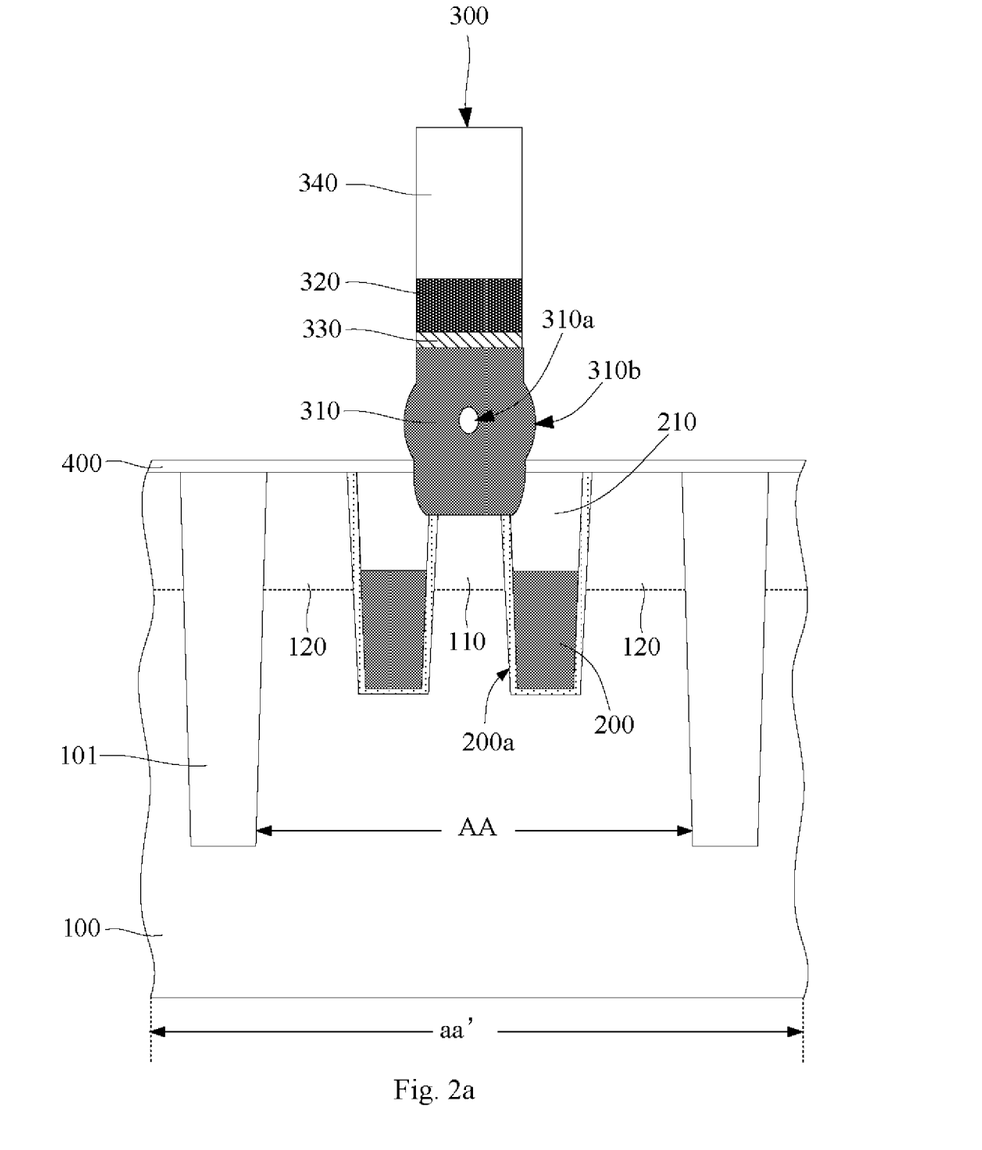
FIG. 2a is a cross-sectional view of the semiconductor device of FIG. 1 taken along line aa'.

FIG. 1 is a top view of a semiconductor device according to a first embodiment of the present invention. FIG. 2a is a cross-sectional view of the semiconductor device of FIG. 1 taken along line aa', while FIG. 2b is a cross-sectional view of the semiconductor device of FIG. 1 taken along line bb'.

Figure 2B:
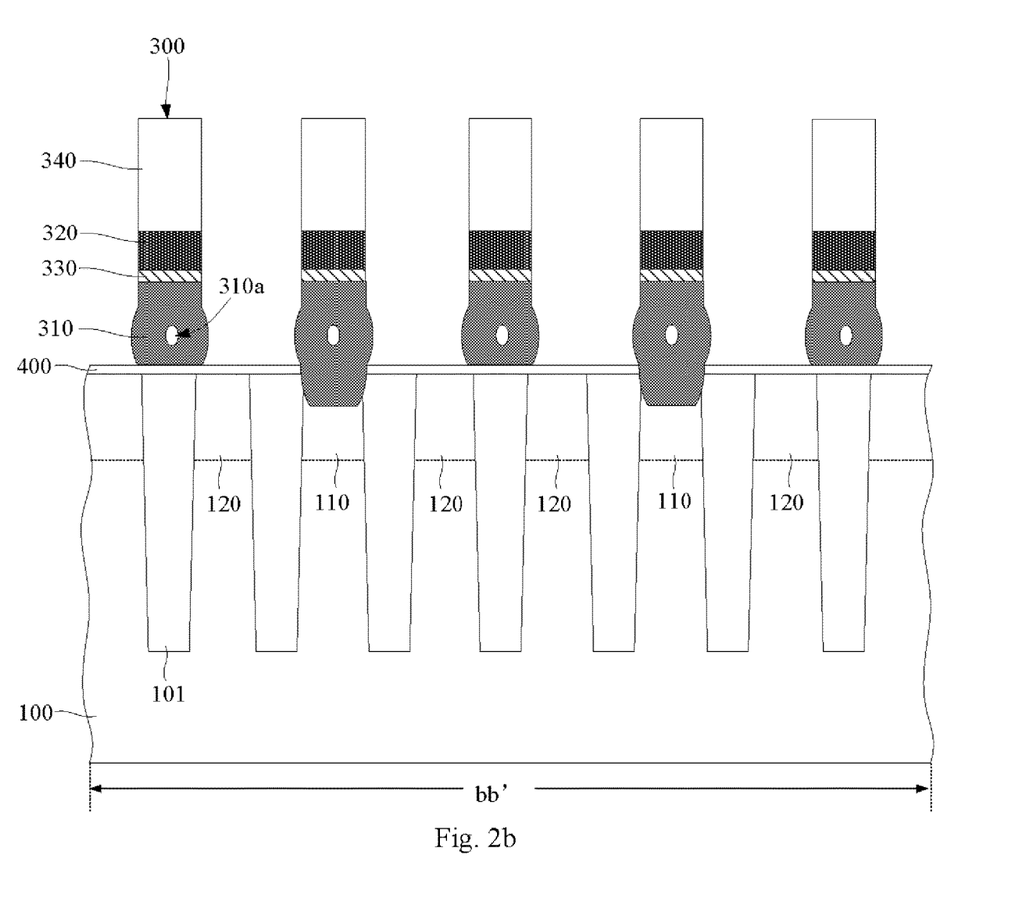
FIG. 2b is a cross-sectional view of the semiconductor device of FIG. 1 taken along line bb'.

As shown in FIGS. 1 and 2a-2b, the semiconductor device includes a substrate 100 as well as buried gates 200 and bit lines 300 formed in/on the substrate 100.

Further, the substrate 100 is formed therein with a plurality of active areas AA. The semiconductor device may be implemented as, for example, a memory. This embodiment will be explained below with the semiconductor device being a memory as an example. To this end, in each of the active areas AA, first source/drain regions 110 and second source/drain regions 120 may be formed to constitute storage transistors. Adjacent active areas AA may be isolated from each other by, for example, trench isolation structures 101.

With continued reference to FIGS. 1 and 2a-2b, in the substrate 100, there are also formed gate trenches 200a, which are at least partially located within the active areas AA and each gate trench 200a filled sequentially with a corresponding one of the buried gates 200 and an insulating material layer 210.

In memory examples, the buried gates 200 are provided to, for example, make up word lines. To this end, the buried gates 200 may extend in a second direction (X direction) and traverse the corresponding active areas AA so that the word lines intersect the active areas AA at portions thereof between the first source/drain regions 110 and the second source/drain regions 120 (i.e., the first and second source/drain regions 110, 120 are located on opposing sides of the word lines), which provide gates of the storage transistors.

In this embodiment, upper surfaces of the buried gates 200 are lower than top edges of the respective gate trenches 200a and the insulating material layers 210 fill the spaces of the gate trenches 200a that are higher than the buried gates 200 so that the buried gates 200 are covered and not exposed.

With particular reference to FIGS. 1 and 2a-2b, the bit lines 300 are formed on the substrate 100 along a first direction (Y direction) so as to traverse the corresponding active areas AA and thus establish electrical connections with the corresponding active areas AA. In this embodiment, the electrical connections are established between the first source/drain regions 110 in the active areas AA and the bit lines 300.

Further, each of the bit lines 300 may include a bit line contact plug 310 which partially resides on the insulating material layer 210, is coupled to corresponding ones of the active areas AA and contains a void 310a. In particular, the bit line contact plug 310 may be fabricated from, for example, a first conductive layer that is formed of, for example, polycrystalline silicon.

In this embodiment, in each of the active areas AA, the bit line contact plug 310 extends laterally from the first source/drain region 110 into the insulating material layer 210 so that a lower surface of the bit line contact plug 310 has a length in the first direction that is greater than or equal to a length of the first source/drain region 110 in the first direction. This can maximize a contact area between the first source/drain region 110 and the bit line contact plug 310, thereby minimizing a contact resistance between the first source/drain region 110 and the bit line contact plug 310, and ensuring good electrical transmission of the bit line contact plug 310 despite the presence of the void 310a.

It is noted that since the presence of the void 310a is allowed in the bit line contact plug 310, the fabrication of the bit line contact plug 310 may be accomplished in a shorter time by using rapid deposition. This can speed up the overall semiconductor device fabrication process, thus resulting in an enhanced throughput and higher utilization of the semiconductor fabrication equipment.

With continued reference to FIGS. 2a and 2b, the bit line contact plug 310 may be partially embedded in the substrate 100, thus additionally increasing the contact area with the active area AA. Moreover, since the active area AA is typically doped with ions which are present at a concentration lower at a surface of the substrate than within the substrate. Therefore, partially embedding the bit line contact plug 310 within the substrate 100 can further reduce the contact resistance between the bit line contact plug 310 and the active area AA and facilitate the connection between the bit line contact plug 310 and the high-ion-concentration region.

As noted above, the bit line contact plug 310 partially resides on the insulating material layer 210 and is coupled to the active area AA. Here, the "partial embedding" of the bit line contact plug 310 in the substrate 100 means that the bit line contact plug 310 extends from its top above the insulating material layer 210 to a bottom located at a predetermined depth in the insulating material layer 210, the bottom of the bit line contact plug 310 is located above an upper surface of the buried gate 200.

With continued reference to FIGS. 2a and 2b, the bit line contact plug 310 may have two opposing surfaces both with outwardly-bulged portions, and the void 310a is formed between two opposing surfaces of the bit line contact plug 310.

In this embodiment, the opposing surfaces of the bit line contact plug 310 may extend along the first direction and the void 310a may be formed between their arcuate portions 310b that directly oppose each other.

As stated above, the bit line contact plug 310 may be partially embedded in the substrate 100. Hereinafter, the portion of the bit line contact plug 310 that is embedded in the substrate 100 is referred to as a third portion, while the portion of the bit line contact plug 310 delimited by the arcuate side face portions 310b that directly oppose each other is referred to as a second portion.

In this embodiment, the void 310a is formed within the second portion of the bit line contact plug 310. That is, the void 310a is formed within a portion of the bit line contact plug 310 above the substrate 100. It will be appreciated that, in this embodiment, since the side faces of the second portion bulge beyond the side faces of the third portion, the second portion has a greater width that ensures its electrical properties in spite of the presence of the void 310a therein.

It is noted that forming the void 310a in a portion of the bit line contact plug 310 above the substrate 100 can prevent the void 310a from getting too close to the active area AA and hence facilitate the establishment of a good connection between the bit line 300 and the active area AA. It is a matter of course that it is possible for the void 310a in the bit line 300 to have its lowest point lower than the upper surface of the substrate 100 as long as it does not reaches a doped surface of the active area AA.

With continued reference to FIGS. 2a and 2b, the bit line contact plug 310 may additionally have a first portion that overlies the second portion and has a maximum width smaller than that of the second portion. In other words, in this embodiment, the side faces of the second portion bulge beyond those of both the first and third portions.

In an alternative embodiment, in the bit line contact plug 310, the second portion may have a height greater than that of the first portion, thus allowing a sufficient space for the formation of the void 310a. Alternatively, this may be interpreted as allowing a greater portion of the bit line 300 to be formed by rapid deposition and thus more efficient formation of the whole bit line 300.

With continued reference to FIGS. 2a and 2b, the bit line 300 may further include a second conductive layer 320 overlying the bit line contact plug 310 and configured to enable further electrical transmission. In particular, materials from which the second conductive layer 320 can be fabricated may include tungsten, for example.

In an alternative embodiment, the bit line contact plug 310 may have a maximum width that is greater than a maximum width of the second conductive layer 320. It is noted that the greater width of the bit line contact plug 310 (i.e., the maximum width of the bit line contact plug 310 is greater than the maximum width of the second conductive layer 320) not only facilitates electrical transmission performance of the bit line contact plug 310 so that the bit line contact plug 310 can exhibit the desired properties despite the presence of the void 310a therein, but also allows an increased contact area and hence better connection between the bit line contact plug 310 and the active area AA. Thus, the performance of the bit line contact plug 310 is not significantly affected by the void 310a formed in the bit line contact plug 310.

Further, the maximum width of the bit line contact plug 310 is greater than that of the second conductive layer 320 because of its lateral protrusions beyond the second conductive layer 320 in the second direction (X direction), which are at the same level as the void 310a in the bit line contact plug 310. In this embodiment, the lateral protrusions of the bit line contact plug 310 correspond to the arcuate side face portions 310b.

With continued reference to FIGS. 2a and 2b, the bit line 300 may further include a third conductive layer 330 formed between the bit line contact plug 310 and the second conductive layer 320. Materials from which the third conductive layer 330 can be fabricated may include titanium nitride, for example.

In this embodiment, the third conductive layer 330 may reside on the first portion of the bit line contact plug 310 and the side face of the third conductive layer 330 is aligned with the side face of the first portion.

Further, the bit line 300 may further include a cap layer 340 that covers the second conductive layer 320. Materials from which the cap layer 340 can be fabricated may include, silicon nitride, for example. In this embodiment, the cap layer 340, the second conductive layer 320 and the third conductive layer 330 may be aligned with one another at their side faces.

With particular reference to FIG. 2b, the upper surface of the substrate 100 may be covered by an isolation layer 400 so that the bit line 300 is located partially above the isolation layer 400. In particular, a portion of the bit line 300 brought into contact with the active area AA may penetrate through the isolation layer 400 as well as the upper surface of the substrate 100, with the remainder of the bit line 300 situated above the isolation layer 400 and isolated thereby from the substrate 100. Materials from which the isolation layer 400 can be fabricated may include, for example, silicon nitride, titanium nitride or a combination thereof.

Figure 3:
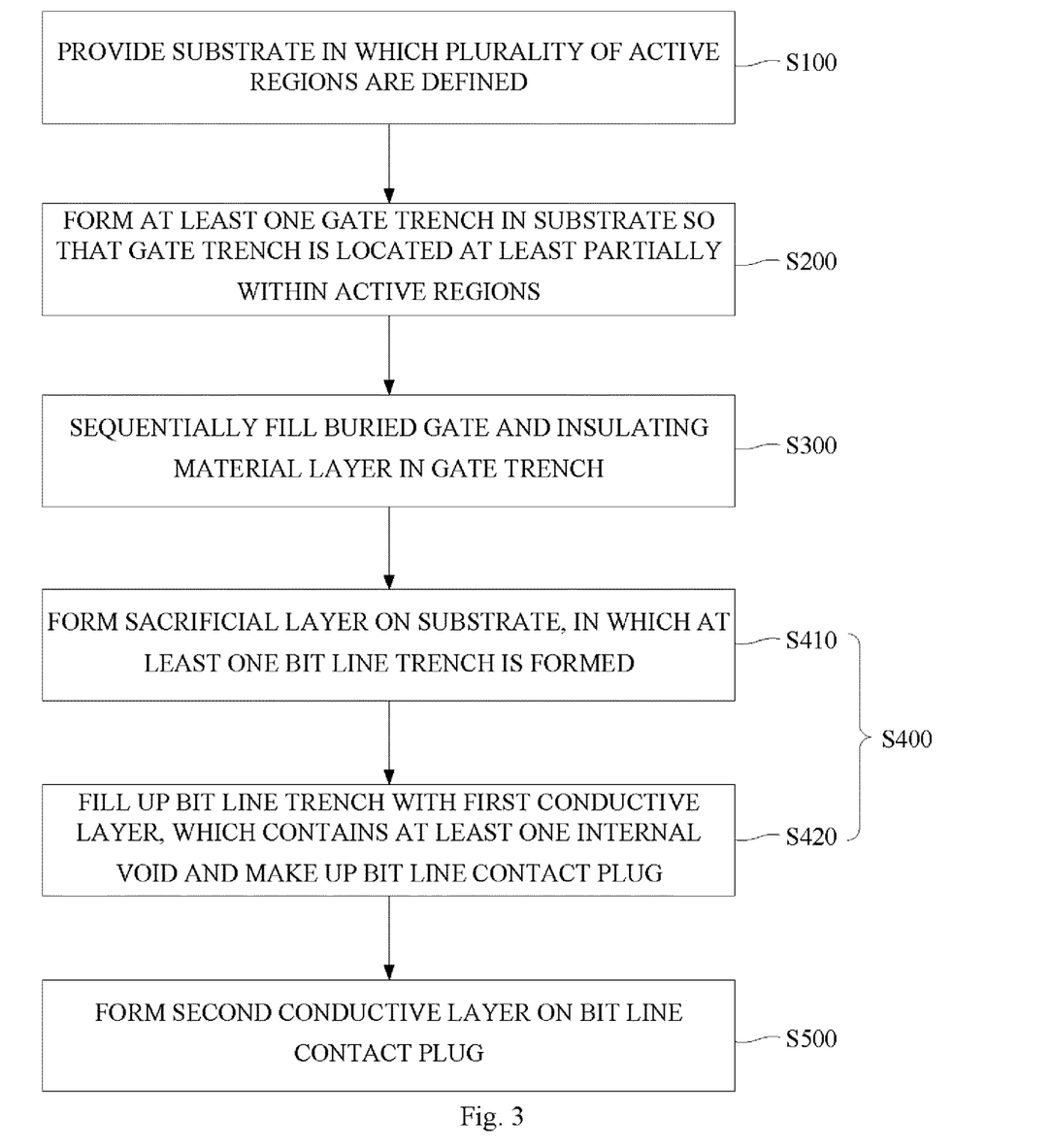
FIG. 3 is a flowchart of a method for fabricating a semiconductor device according to the first embodiment of the present invention.

A method for forming such a semiconductor device will be described below with reference to the flowchart shown in FIG. 3. As shown, the method includes the steps of: S100) providing a substrate defining therein a plurality of active areas; S200) forming at least one gate trench in the substrate so that the gate trench is at least partially located within the active areas; S300) sequentially filling a buried gate and an insulating material in the gate trench; and S400) forming in the substrate a bit line contact plug partially residing on the insulating material in a corresponding one of the active areas and thus coupled to the active area, the bit line contact plug containing a void.

The method according to this embodiment will be described in greater detail below with reference to FIGS. 4a to 4e which schematically show structures resulting from various steps in the method.

Figure 4A:
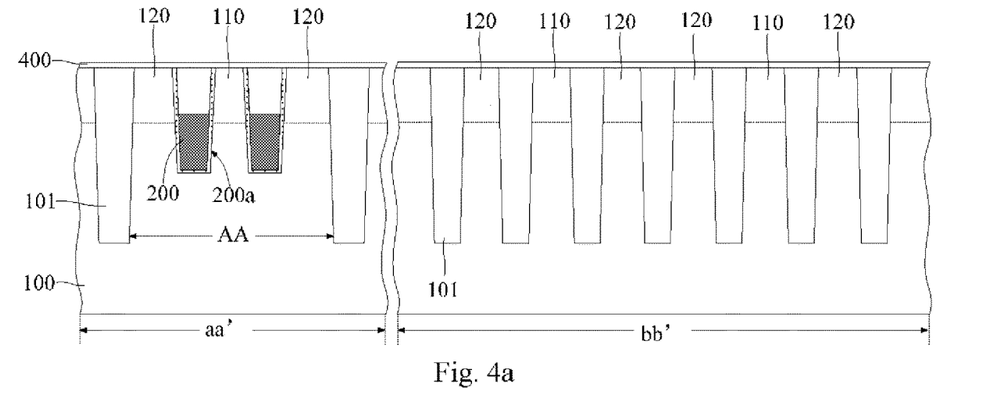
FIGS. 4a to 4e are schematics showing structures resulting from steps in the method of FIG. 3.

In step S100, as shown in FIG. 4a, a substrate 100 is provided, in which a plurality of active areas AA are defined. In this embodiment, first source/drain regions 110 and second source/drain regions 120 are formed in the active areas AA.

In particular, the active areas AA may be delimited by trench isolation structures 101 formed in the substrate 100.

In step S200, with continued reference to FIG. 4a, at least one gate trench 200a is formed in the substrate 100 so that the gate trench 200a is at least partially located within the active areas AA. In this embodiment, in each of the active areas AA, the first and second source/drain regions 110, 120 may be formed on opposing sides of word line trenches 200a traversing the active area AA along the second direction.

In step S300, with continued reference to FIG. 4a, each of the gate trenches 200a is filled with a buried gate 200 and an insulating material layer 210.

In this embodiment, the buried gate 200 is deposited to form a word line of the memory being fabricated in such a manner that an upper surface of the buried gate 200 is lower than an upper surface of the word line trench 200a, with the insulating material layer 210 filling up the space in the word line trench 200a higher than the buried gate 200 and thus covering the buried gate 200.

In other embodiments, the method may further include, subsequent to the formation of the buried gate 200, covering the upper surface of the substrate 100 and thus the active areas AA with an isolation layer 400.

In this embodiment, the isolation layer 400 may be formed simultaneously with the filling of the insulating material layer 210. For example, the insulating material may be deposited over the substrate 100 so as to fill up the word line trenches 200*a* and cover the upper surface of the substrate 100. A planarization process may follow to form the isolation layer 400.

Figure 4B:
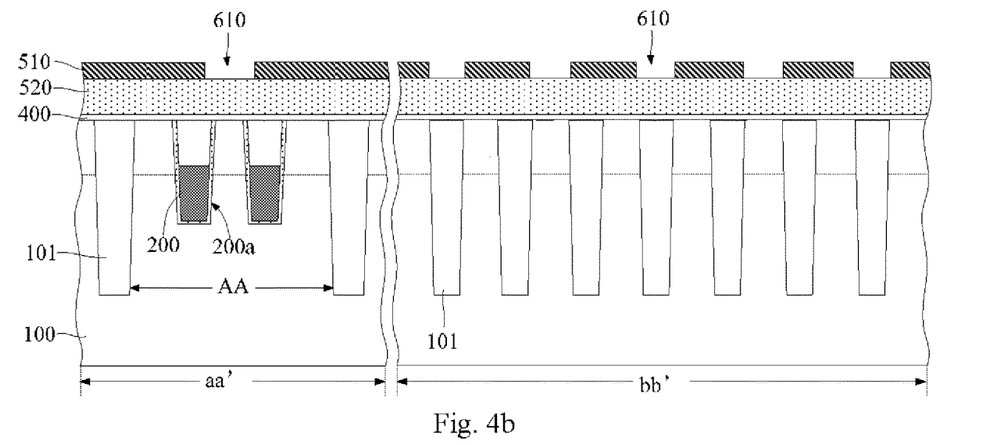
Figure 4C:
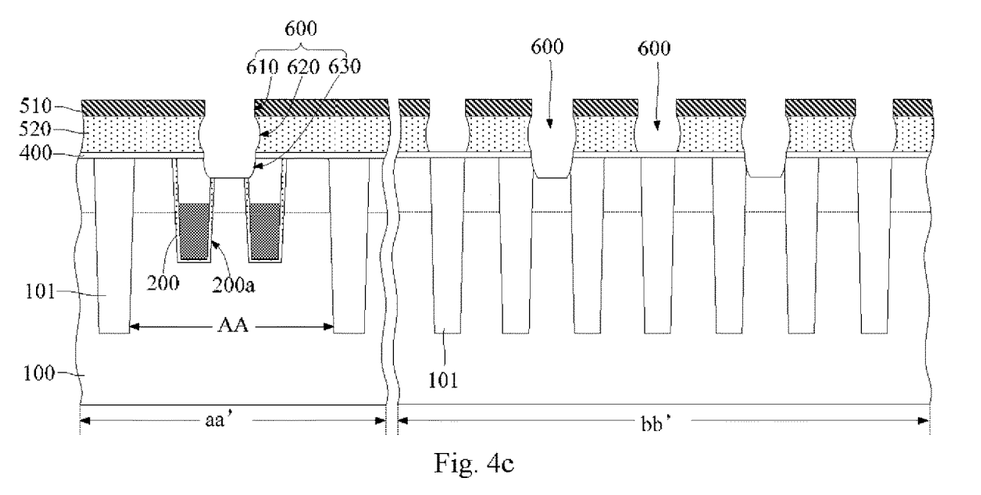
Figure 4D:
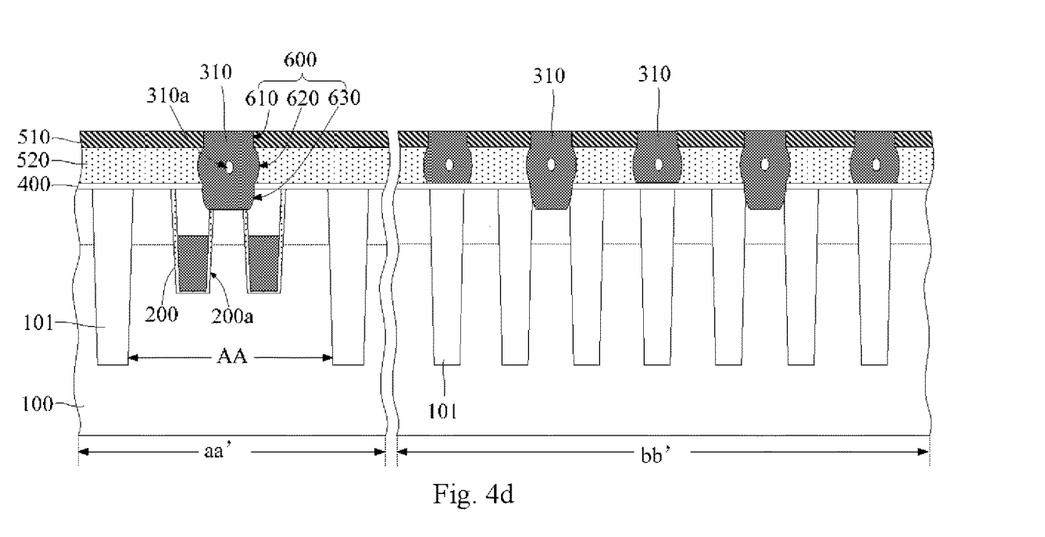

In step S400, as shown in FIGS. 4*b* to 4*d*, a bit line contact plug 310 is formed on the substrate 100, which partially resides on the insulating material layer 210 in a corresponding one of the active areas AA and thus coupled to the active area AA. In addition, a void 310*a* is formed within the bit line contact plug 310.

Specifically, the method for forming the bit line contact plug 310 includes the following steps.

In step S410, with particular reference to FIGS. 4*b* to 4*c*, a sacrificial layer may be formed on the substrate 100, in which at least one bit line trench 600 extending in the first direction is formed. In a subsequent process, a first conductive layer of the bit line will be received in the bit line trench 600.

With particular reference to FIG. 4*c*, the sacrificial layer may include a first sacrificial material layer 510 and a second sacrificial material layer 520 underlying the first sacrificial material layer 510. Accordingly, the bit line trench 600 may include a first trench 610 and a second trench 620 communicatively joined therewith. In particular, the first trench 610 may be formed in the first sacrificial material layer 510, while the second trench 620 may be formed in the second sacrificial material layer 520. The first trench 610 is positioned above the second trench 620.

The bit line trench may be formed by a method including the steps of: 1) referring in particular to FIG. 4*b*, forming the second sacrificial material layer 520 on the substrate 100 and the first sacrificial material layer 510 on the second sacrificial material layer 520; 2) referring in particular to FIG. 4*b*, patterning the first sacrificial material layer 510 to form therein the first trench 610 extending in the first direction; and 3) referring in particular to FIG. 4*c*, etching the second sacrificial material layer 520 with the aid of the first trench 610 in the first sacrificial material layer 510 so as to form the second trench 620 in the second sacrificial material layer 520. The second trench 620 has side faces that are bulged outwardly beyond respective side faces of the first trench 610 so that a maximum opening size of the second trench 620 is greater than a maximum opening size of the first trench 610. In particular, the bulged side faces of the second trench 620 may be, for example, arcuate surfaces.

In particular, the second trench 620 may be formed by performing an etching process on the second sacrificial material layer 520, which has a great selectivity ratio of the second sacrificial material layer 520 to the first sacrificial material layer 510 (e.g., greater than or equal to 4:1). Such an etching process is capable of a high etching speed for the second sacrificial material layer 520, while leaving minor damage to the first sacrificial material layer 510.

Further, a duration of the etching process may be adjusted to achieve a desired opening size of the second trench 620. For example, the second sacrificial material layer 520 may be etched for a longer time to widen the second trench 620 or may be etched for a shorter time to narrow the second trench 620.

In this embodiment, the bit line trench 600 may be tapered upwardly so that it can be filled up in a shorter time during a subsequent rapid deposition process for forming the first conductive layer. In this way, the bit line contact plug can be fabricated more efficiently.

In other embodiments, the bit line trench 600 may be bottomed within the substrate 100. That is, the bit line trench 600 may extend from its top above the insulating material layer 210 to a bottom located at a predetermined depth in the insulating material layer, the bottom of the bit line contact plug is located above the upper surface of the buried gate 200. The portion of the bit line trench 600 extending within the substrate 100 may form a third trench 630, in which the active area AA is exposed.

In particular, the third trench 630 of the bit line trench 600 may be formed by a method including: etching the portion of the substrate 100 that corresponds to the active area AA with the aid of both the first trench 610 and the second trench 620 so that the third trench 630 is formed in the substrate 100. In this embodiment, the first source/drain region 110 in the active area AA may be exposed in the third trench 630.

In an alternative embodiment, the third trench 630 may have a bottom length in the first direction that is greater than or equal to a length of the first source/drain region 110 in the same direction. This can maximize the exposed area of the first source/drain region 110, thus maximizing the contact area of the first source/drain region 110 with the bit line being fabricated.

In this embodiment, the bottom length of the third trench 630 in the first direction may be greater than the length of the first source/drain region 110 in the same direction so that the third trench 630 is expanded into the word line trench 200*a* and stops within the insulating material layer 210 in the word line trench 200*a*.

Further, as noted above, in case of an isolation layer 400 formed on the upper surface of the substrate 100, the portion of the isolation layer 400 overlying the first source/drain region 110 may be etched during the formation of the bit line trench 600 in order to expose the first source/drain region 110.

In step S420 of the formation of the bit line contact plug 310, with particular reference to FIG. 4*d*, the first conductive layer is filled in the bit line trench 600, which contains at least one internal void 310*a* and forms the bit line contact plug 300.

In this embodiment, since the bit line trench 600 is made up of the third trench 630, the second trench 620 communicatively joined with the third trench 630 and the first trench 610 communicatively joined with the second trench 620, during the formation of the first conductive layer, a deposition process may be performed to successively fill up the third, second and first trenches 630, 620 and 610. The deposition process may be, for example, a chemical vapor deposition (CVD) process.

It is noted that since the second trench 620 has a greater opening size, avoid 310*a* tends to form in the first conductive material filled in the second trench 620. For example, during the deposition process, the first conductive material will grow over the inner side walls toward the top edges of the second trench 620, thus increasingly narrowing the top opening of the second trench 620. As a result, there may be a space unfilled by the first conductive material, i.e., a void 310*a* in the first conductive material, upon the closure of the top opening of the second trench 620.

In particular, in this embodiment, the first trench 610 communicatively joined to the second trench 620 thereabove may have an opening size smaller that of the second trench 620. This can facilitate closure of the second trench 620 at a position close to the first trench 610 during the deposition of the first conductive material, which is favorable to the formation of a void 310*a*.

The formation of the bit line contact plug 310 may further involve a planarization process. In this case, the first conductive material may be deposited onto the substrate 100 until it has filled up the bit line trench 600 and covered an upper surface of the sacrificial layer. Subsequently, the planarization process may be performed to remove an undesired portion of the deposited first conductive material above the upper edges of the bit line trench 600. As a result of this process, the first conductive material remaining in the bit line trench 600 constitutes the bit line contact plug 310 that does not protrude beyond the sacrificial layer (e.g., the upper surface of the bit line contact plug 310 is flush with that of the sacrificial layer).

Thus, in this embodiment, a desired contact area between the bit line contact plug 310 and the active area AA can be ensured by controlling a width of the first conductive layer formed in the bit line trench 600 in the sacrificial layer. In this way, even when there is a void 310a formed in the bit line contact plug 310, good electrical properties of the bit line contact plug 310 can ensured. Moreover, since the bit line contact plug 310 is allowed to contain a void 310a, the first conductive layer can be formed using a rapid deposition process which can enhance the semiconductor device fabrication efficiency.

Figure 4E:
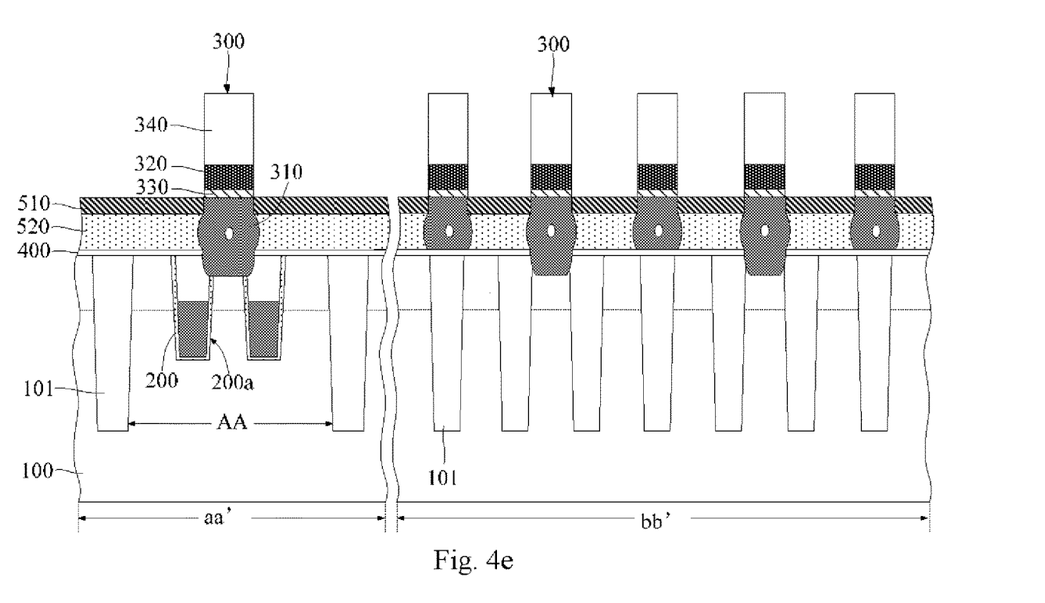

In additional embodiments, the method may further include, in step S500, forming a second conductive layer on the bit line contact plug 310.

Specifically, in step S500, with particular reference to FIG. 4e, the second conductive layer 320 is formed on the bit line contact plug 310. In this embodiment, the second conductive layer 320 together with the bit line contact plug 310 may form a bit line 300 of the memory being fabricated and the second conductive layer 320 may have a maximum width smaller than that of the bit line contact plug 310.

Formation of the second conductive layer 320 may include a deposition process and a patterning process. In particular, during the formation of the second conductive layer 320, the deposition process may be performed first to deposit a second conductive material layer on the substrate 100, which covers both the sacrificial layer and the bit line contact plug 310. The patterning process may be then carried out to form the second conductive layer 320 on the bit line contact plug 310 by patterning the second conductive material layer. In this embodiment, the second conductive layer 320 may have a width that is close or equal to a width of the bit line contact plug 310 within the first trench 610.

Further, forming the second conductive layer 320 by patterning the second conductive material layer may include forming a patterned mask layer on the second conductive material layer and forming the second conductive layer 320 by etching the second conductive material layer with the aid of the mask layer. In this embodiment, subsequent to the etching of the second conductive material layer, the mask layer may be retained and form a cap layer 340 of the bit line 300.

With continued reference to FIG. 4e, according to this embodiment, the bit line 300 may further include a third conductive layer 330 formed between the bit line contact plug 310 and the second conductive layer 320. The third conductive layer 330 and the second conductive layer 320 may be formed in the same patterning process. That is, after the etching of the second conductive material layer with the aid of the mask layer is completed, the process may be continued to the exposed third conductive material layer so as to form the third conductive layer 330 which is aligned with the second conductive layer 320 at the side faces.

It is noted that, in this embodiment, the sacrificial layer (including both the first and second sacrificial material layers 510, 520) is not removed after the formation of the bit line contact plug 310. At this point, the sacrificial layer and the bit line contact plug 310 can together provide a flat surface to the subsequent formation of the third and second conductive layers 330, 320. It will be appreciated that the flat surface allows higher accuracy of the deposition, photolithography and etching processes involved in the formation by patterning of the third and second conductive layers 330, 320. As a result, higher shape accuracy of the bit line 300 can be obtained.

The sacrificial layer may be removed, after the bit line 300 is formed.

Embodiment 2

Figure 5:
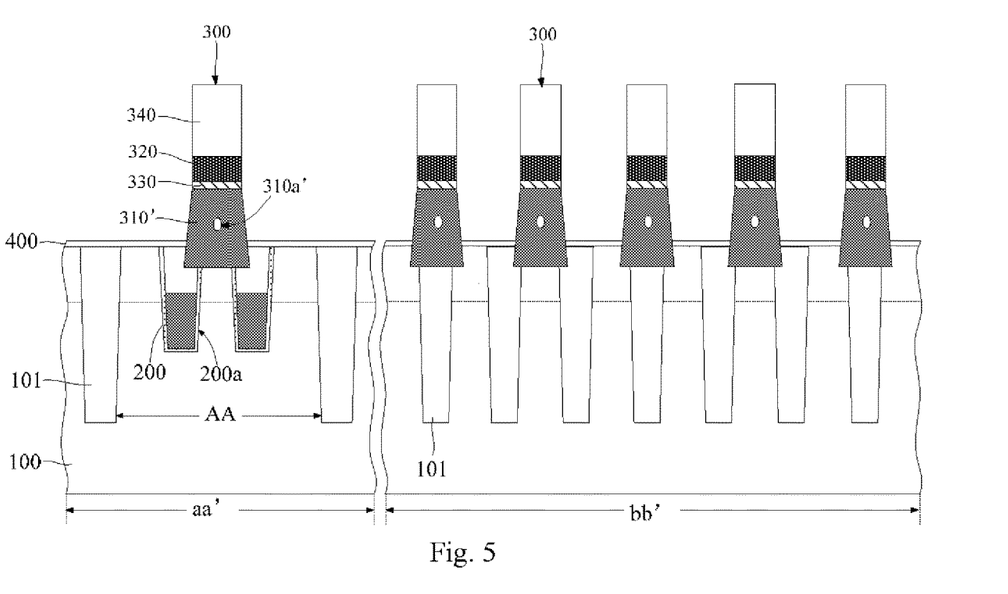
FIG. 5 schematically illustrates a semiconductor device according to a second embodiment of the present invention.

This embodiment differs from Embodiment 1 in a trapezoidal cross-section of the bit line contact plug, which has a top base and a bottom base longer than the top base. That is, the bit line contact plug according to this embodiment gradually widens from the top downward so as to ensure sufficient contact at the bottom with the active area.

FIG. 5 is a schematic diagram showing the structure of a semiconductor device according to this Embodiment 2. As shown in FIG. 5, the bit line contact plug 310' has a trapezoidal cross-section in the direction perpendicular to the first direction (i.e., the bit line contact plug 310' has a trapezoidal cross-section in the width-wise direction). The bit line contact plug 310' has a lower portion extending from the upper surface of the insulating material layer 210 to the predetermined depth. The lower portion also has a trapezoidal cross-section with a top base and a bottom base longer than the top base.

In this embodiment, the bottom base of the trapezoidal cross-section of the bit line contact plug 310' has a length greater than the width of the second conductive layer 320. In addition, the top base of the trapezoidal cross-section of the bit line contact plug 310' has a length that is equal to or close to the width of the second conductive layer 320.

With continued reference to FIG. 5, there is avoid 310a' formed in the bit line contact plug 310'. The void 310a' in the bit line contact plug 310' may be located above the upper surface of the substrate so as to be distant from the active area AA. Of course, the void 310a' may also be formed in the portion of the bit line contact plug 310' embedded in the substrate, i.e., the lower portion of the bit line contact plug 310', as long as the void 310a' does not come into contact with the surface of the active area AA.

With similarity to Embodiment 1, the bit line contact plug 310' may be formed preferably by filling a first conductive layer into a bit line trench defined in a sacrificial layer.

It is noted that the bit line contact plug 310' according to this embodiment has a trapezoidal cross-section with a top base and a bottom base longer than the top base. To this end, the bit line trench may be formed by a method including, for example, the steps of: forming a first layer on the substrate, wherein the first layer defines a pattern corresponding to the bit line trench, the first pattern having two opposing side faces that are inclined; then forming a second layer over the first layer so that the second layer has inclined side walls corresponding to the respective inclined side faces of the aforesaid pattern and both inclined at an acute angle with respect to the substrate surface; and then removing the first layer so that the bit line trench having an upwardly tapered trapezoidal cross-section is formed.

Further, similar to Embodiment 1, the bit line trench may extend into the substrate. That is, the bit line trench may extend from its top above the upper surface of the insulating material layer 210 to a bottom located at a predetermined depth within the insulating material layer 210, the bottom of the bit line contact plug is located above the upper surface of the buried gate 200. In this case, the portion of the bit line trench extending from the upper surface of the insulating material layer 210 to the predetermined depth forms a third trench. The third trench also has a trapezoidal cross-section with a top base and a bottom base longer than the top base.

Further, the formation of the bit line contact plug 310' may be followed by the formation of the third conductive layer 330, the second conductive layer 320 and the cap layer 340. Since the formation of these components can be accomplished in a similar manner as described in Embodiment 1, a more lengthy description is deemed unnecessary.

In summary, in the semiconductor device according to this embodiment, since the bit line contact plug is brought into sufficient contact with the active area, even when there is a void within the bit line contact plug, good signal transmission can be ensured between the bit line contact plug and the active area. Additionally, such a bit line contact plug allowed to contain a void can be fabricated in an easier and hence faster manner, resulting in an enhanced semiconductor device fabrication throughput and higher utilization of the semiconductor fabrication equipment.

Further, the bit line contact plug may have a maximum width that is greater than a width of the second conductive layer. This can improve electrical transmission performance of the bit line contact plug and result in a greater contact area between the bit line contact plug and the active area.

Furthermore, the bit line contact plug may extend into the substrate and is thereby electrically connected to the active area within the substrate. This enables both an even greater contact area between the bit line contact plug and the active area and an electrical connection between them in a region with a high ion concentration, which can result in an additional improvement in signal transmission between the bit line contact plug and the active area.

It is noted that while the invention has been described with reference to several preferred embodiments, it is not intended to be limited to these embodiments in any way. In light of the above teachings, any person of skill in the art may make various possible variations and changes to the subject matter of the present invention or modify it to equivalent alternatives without departing from the scope of the invention. Accordingly, any and all such simple variations, equivalent alternatives and modifications made without departing from the scope of the invention are intended to fall within this scope.

It should be appreciated that, the terms "first", "second", "third" and the like as used herein are only intended to distinguish between various components, elements, steps, etc. rather than implying any logical or ordinal relationship among them, unless otherwise specified or indicated.

It is also to be understood that the terminology used herein is used for the purpose of describing particular embodiments only, and is not intended to limit the scope of the present invention. It must be noted that as used herein and in the appended claims, the singular forms "a" and "an" include the plural reference unless the context clearly dictates otherwise. Thus, for example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Implementation of the methods and/or device according to the embodiments of the present invention involves performing or completing certain selected tasks or steps manually, automatically, or a combination thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   providing a substrate, in which a plurality of active areas are defined;
   forming at least one gate trench in the substrate so that the gate trench is located at least partially within the plurality of active areas;
   sequentially filling a buried gate and an insulating material layer in the gate trench; and
   forming at least one bit line contact plug on the substrate, each formed over a portion of the insulating material layer and coupled to one of the plurality of active areas, each of the at least one bit line contact plug containing a void being formed in a portion of the bit line contact plug having a maximum width.

2. The method of claim 1, wherein forming the at least one bit line contact plug comprises:
   forming a sacrificial layer on the substrate, in which at least one bit line trench extending in a first direction is formed; and
   filling the at least one bit line trench with a first conductive layer, the first conductive layer configured to form the at least one bit line contact plug, the first conductive layer containing at least one internal void.

3. The method of claim 2, wherein forming the sacrificial layer with the at least one bit line trench comprises:
   successively forming a second sacrificial material layer on the substrate and a first sacrificial material layer on the second sacrificial material layer;
   patterning the first sacrificial material layer so that a first trench extending in the first direction is formed in the first sacrificial material layer; and
   etching the second sacrificial material layer through the first trench in the first sacrificial material layer so that a second trench is formed in the second sacrificial material layer, wherein the second trench comprises side faces that are bulged outwardly beyond respective side faces of the first trench so that a maximum opening size of the second trench is greater than a maximum opening size of the first trench.

4. The method of claim 3, wherein the bulged side faces of the second trench are arcuate.

5. The method of claim 3, wherein forming the first conductive layer comprises:
   filling both the first and second trenches by depositing a first conductive material on the substrate in such a manner that the void is formed in the first conductive material deposited within the second trench.

6. The method of claim 2, wherein the bit line trench extends from a top above an upper surface of the insulating material layer to a bottom located at a predetermined depth in the insulating material layer, the bottom of the bit line contact plug located above an upper surface of the buried gate.

7. The method of claim 6, wherein a lower portion of the bit line trench below the upper surface of the insulating material layer has a trapezoidal cross-section with a bottom base longer than a top base.

8. The method of claim 2, further comprising, subsequent to the formation of the at least one bit line contact plug:
forming a second conductive layer on the at least one bit line contact plug, the second conductive layer having a maximum width smaller than a maximum width of the first conductive layer.

9. The method of claim 8, wherein forming the second conductive layer comprises:
depositing a second conductive material layer on the substrate, the second conductive material layer covering the at least one bit line contact plug; and
patterning the second conductive material layer to form the second conductive layer, the second conductive layer extending over the first conductive layer in the first direction.

10. A method of fabricating a semiconductor device, comprising:
providing a substrate, in which a plurality of active areas are defined;
forming at least one gate trench in the substrate so that the gate trench is located at least partially within the plurality of active areas;
sequentially filling a buried gate and an insulating material layer in the gate trench; and
forming at least one bit line contact plug on the substrate, each formed over a portion of the insulating material layer and coupled to one of the plurality of active areas, each of the at least one bit line contact plug containing a void, wherein forming the at least one bit line contact plug comprises:
forming a sacrificial layer on the substrate, in which at least one bit line trench extending in a first direction is formed; and
filling the at least one bit line trench with a first conductive layer, the first conductive layer configured to form the at least one bit line contact plug, the first conductive layer containing at least one internal void, wherein forming the sacrificial layer with the at least one bit line trench comprises:
successively forming a second sacrificial material layer on the substrate and a first sacrificial material layer on the second sacrificial material layer;
patterning the first sacrificial material layer so that a first trench extending in the first direction is formed in the first sacrificial material layer; and
etching the second sacrificial material layer through the first trench in the first sacrificial material layer so that a second trench is formed in the second sacrificial material layer, wherein the second trench comprises side faces that are bulged outwardly beyond respective side faces of the first trench so that a maximum opening size of the second trench is greater than a maximum opening size of the first trench.

11. The method of claim 10, wherein the bulged side faces of the second trench are arcuate.

12. The method of claim 10, wherein forming the first conductive layer comprises:
filling both the first and second trenches by depositing a first conductive material on the substrate in such a manner that the void is formed in the first conductive material deposited within the second trench.

13. The method of claim 10, wherein the bit line trench extends from a top above an upper surface of the insulating material layer to a bottom located at a predetermined depth in the insulating material layer, the bottom of the bit line contact plug located above an upper surface of the buried gate.

14. The method of claim 10, wherein a lower portion of the bit line trench below the upper surface of the insulating material layer has a trapezoidal cross-section with a bottom base longer than a top base.

15. The method of claim 10, further comprising, subsequent to the formation of the at least one bit line contact plug:
forming a second conductive layer on the at least one bit line contact plug, the second conductive layer having a maximum width smaller than a maximum width of the first conductive layer.

16. The method of claim 15, wherein forming the second conductive layer comprises:
depositing a second conductive material layer on the substrate, the second conductive material layer covering the at least one bit line contact plug; and
patterning the second conductive material layer to form the second conductive layer, the second conductive layer extending over the first conductive layer in the first direction.

* * * * *